United States Patent
Roy et al.

(10) Patent No.: US 10,840,186 B2
(45) Date of Patent: Nov. 17, 2020

(54) METHODS OF FORMING SELF-ALIGNED VIAS AND AIR GAPS

(71) Applicant: Applied Materials, Inc., Santa Clara, CA (US)

(72) Inventors: Susmit Singha Roy, Sunnyvale, CA (US); Ziqing Duan, San Jose, CA (US); Abhijit Basu Mallick, Palo Alto, CA (US); Praburam Gopalraja, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/522,130

(22) Filed: Jul. 25, 2019

(65) Prior Publication Data

US 2019/0348368 A1 Nov. 14, 2019

Related U.S. Application Data

(63) Continuation of application No. 16/003,827, filed on Jun. 8, 2018, now Pat. No. 10,403,542.

(60) Provisional application No. 62/517,855, filed on Jun. 10, 2017.

(51) Int. Cl.
*H01L 23/532* (2006.01)
*H01L 21/67* (2006.01)

(52) U.S. Cl.
CPC .... *H01L 23/5329* (2013.01); *H01L 21/67138* (2013.01); *H01L 23/53266* (2013.01)

(58) Field of Classification Search
CPC .......... H01J 37/32091; H01J 37/32165; H01L 21/311; H01L 21/76807; H01L 21/7682; H01L 21/76897; H01L 23/53266; H01L 23/5329

See application file for complete search history.

(56) References Cited

U.S. PATENT DOCUMENTS

| | | |
|---|---|---|
| 4,671,970 A | 6/1987 | Keiser et al. |
| 5,824,597 A | 10/1998 | Hong |
| 6,130,151 A | 10/2000 | Lin et al. |
| 6,143,653 A | 11/2000 | Tsai et al. |
| 6,528,884 B1 | 3/2003 | Lopatin et al. |
| 6,576,113 B1 | 6/2003 | Scherer et al. |
| 6,653,200 B2 | 11/2003 | Olsen |

(Continued)

FOREIGN PATENT DOCUMENTS

| | | |
|---|---|---|
| JP | 2008108757 A | 5/2008 |
| JP | 2011060803 A | 3/2011 |

(Continued)

OTHER PUBLICATIONS

PCT International Search Report and Written Opinion in PCT/US2017/037141 dated Aug. 31, 2017, 11 pages.

(Continued)

*Primary Examiner* — Allan R Wilson
(74) *Attorney, Agent, or Firm* — Servilla Whitney LLC

(57) ABSTRACT

A first metallization layer comprises a set of first conductive lines that extend along a first direction on a first dielectric layer on a substrate. Pillars are formed on recessed first dielectric layers and a second dielectric layer covers the pillars. A dual damascene etch provides a contact hole through the second dielectric layer and an etch removes the pillars to form air gaps.

11 Claims, 7 Drawing Sheets

(56) References Cited

U.S. PATENT DOCUMENTS

| | | |
|---|---|---|
| 7,192,803 B1 | 3/2007 | Lin et al. |
| 7,279,119 B2 | 10/2007 | Hellring et al. |
| 7,288,463 B1 | 10/2007 | Papasouliotis |
| 7,541,297 B2 | 6/2009 | Mallick et al. |
| 7,985,977 B2 | 7/2011 | Gogoi et al. |
| 8,034,705 B2 | 10/2011 | Choi et al. |
| 8,338,225 B2 | 12/2012 | Breitwisch et al. |
| 8,575,753 B2 | 11/2013 | Choi et al. |
| 8,951,429 B1 | 2/2015 | Liu et al. |
| 9,012,322 B2 | 4/2015 | Duong et al. |
| 9,117,884 B1 | 8/2015 | Shaviv et al. |
| 9,236,292 B2 | 1/2016 | Romero et al. |
| 9,312,220 B2 | 4/2016 | Lu et al. |
| 9,324,650 B2 | 4/2016 | Edelstein et al. |
| 9,362,165 B1 | 6/2016 | Bouche et al. |
| 9,362,413 B2 | 6/2016 | Yu et al. |
| 9,368,395 B1 | 6/2016 | Wei et al. |
| 9,490,202 B2 | 11/2016 | Lin et al. |
| 9,666,451 B2 | 5/2017 | Wallace et al. |
| 9,679,781 B2 | 6/2017 | Abatchez et al. |
| 9,721,888 B2 | 8/2017 | Chang et al. |
| 9,780,027 B2 * | 10/2017 | Bergendahl ....... H01L 21/76816 |
| 9,837,305 B1 * | 12/2017 | Briggs ............... H01L 21/7682 |
| 9,837,314 B2 | 12/2017 | Smith et al. |
| 10,083,834 B2 | 9/2018 | Thompson et al. |
| 10,319,604 B2 | 6/2019 | Duan et al. |
| 10,319,636 B2 | 6/2019 | Basu et al. |
| 2002/0098642 A1 | 7/2002 | Harris et al. |
| 2002/0163081 A1 | 11/2002 | Aoyama |
| 2003/0143862 A1 | 7/2003 | Iyer |
| 2004/0067649 A1 | 4/2004 | Hellring et al. |
| 2004/0192034 A1 | 9/2004 | Ohiwa et al. |
| 2005/0121768 A1 | 6/2005 | Edelstein et al. |
| 2005/0167846 A1 | 8/2005 | Aoyama |
| 2005/0266627 A1 | 12/2005 | Furukawa et al. |
| 2006/0169576 A1 | 8/2006 | Brown et al. |
| 2006/0286806 A1 | 12/2006 | Ohkuni et al. |
| 2007/0166981 A1 | 7/2007 | Furukawa et al. |
| 2007/0199922 A1 | 8/2007 | Shen et al. |
| 2008/0160783 A1 | 7/2008 | Watanabe et al. |
| 2008/0182411 A1 | 7/2008 | Elers |
| 2008/0242097 A1 | 10/2008 | Boescke et al. |
| 2009/0017631 A1 | 1/2009 | Bencher |
| 2009/0072409 A1 | 3/2009 | Nitta et al. |
| 2009/0174040 A1 | 7/2009 | Gogoi et al. |
| 2009/0269569 A1 | 10/2009 | Fucsko et al. |
| 2010/0078617 A1 | 4/2010 | Breitwisch et al. |
| 2010/0096691 A1 | 4/2010 | Shin et al. |
| 2010/0171220 A1 | 7/2010 | Cheng-Lin |
| 2010/0173494 A1 | 7/2010 | Kobrin |
| 2010/0203725 A1 | 8/2010 | Choi et al. |
| 2010/0301480 A1 | 12/2010 | Choi et al. |
| 2010/0330805 A1 | 12/2010 | Doan et al. |
| 2011/0049568 A1 | 3/2011 | Lochtefeld et al. |
| 2011/0057317 A1 | 3/2011 | Koike et al. |
| 2011/0089393 A1 | 4/2011 | Kuo-Pin et al. |
| 2011/0108992 A1 * | 5/2011 | Chanda ............. H01L 21/76849 257/773 |
| 2011/0207318 A1 | 8/2011 | Usami |
| 2011/0281417 A1 | 11/2011 | Gordon et al. |
| 2012/0115302 A1 | 5/2012 | Breitwisch et al. |
| 2012/0156857 A1 | 6/2012 | Cohen |
| 2012/0178235 A1 | 7/2012 | Pachamuthu et al. |
| 2013/0072019 A1 | 3/2013 | Ryan |
| 2013/0109148 A1 | 5/2013 | Oh et al. |
| 2013/0241037 A1 | 9/2013 | Jeong et al. |
| 2013/0264533 A1 | 10/2013 | Cheong et al. |
| 2014/0029181 A1 | 1/2014 | Gstrein |
| 2014/0264747 A1 | 9/2014 | Barabash |
| 2014/0264896 A1 | 9/2014 | Wei et al. |
| 2014/0327140 A1 | 11/2014 | Zhang et al. |
| 2015/0091186 A1 * | 4/2015 | Yang ................. H01L 27/11582 257/774 |
| 2015/0111374 A1 | 4/2015 | Bao et al. |
| 2015/0132901 A1 | 5/2015 | Wang et al. |
| 2015/0137113 A1 | 5/2015 | Yu et al. |
| 2015/0170956 A1 | 6/2015 | Naik et al. |
| 2015/0279736 A1 | 10/2015 | Hotta et al. |
| 2015/0287675 A1 | 10/2015 | Shaviv |
| 2015/0325622 A1 | 11/2015 | Zhang et al. |
| 2015/0357439 A1 | 12/2015 | Liu et al. |
| 2015/0364420 A1 | 12/2015 | Mei et al. |
| 2015/0371896 A1 | 12/2015 | Chen et al. |
| 2016/0049427 A1 | 2/2016 | Zang |
| 2016/0056074 A1 | 2/2016 | Na |
| 2016/0056104 A1 | 2/2016 | Bouche et al. |
| 2016/0068710 A1 | 3/2016 | Wang et al. |
| 2016/0093635 A1 | 3/2016 | Rabkin et al. |
| 2016/0111342 A1 | 4/2016 | Huang et al. |
| 2016/0141416 A1 | 5/2016 | Mariani et al. |
| 2016/0163587 A1 | 6/2016 | Backes et al. |
| 2016/0163640 A1 | 6/2016 | Edelstein et al. |
| 2016/0190008 A1 | 6/2016 | Chandrashekar et al. |
| 2016/0190009 A1 | 6/2016 | Wallace et al. |
| 2016/0260779 A1 | 9/2016 | Kawashima et al. |
| 2017/0076945 A1 | 3/2017 | Hudson |
| 2017/0077037 A1 | 3/2017 | Kelly et al. |
| 2017/0186849 A1 | 6/2017 | Chen et al. |
| 2017/0194191 A1 * | 7/2017 | Chen .................. H01L 23/5222 |
| 2017/0263563 A1 | 9/2017 | Dutta et al. |
| 2017/0338149 A1 | 11/2017 | Lin |
| 2018/0096847 A1 | 4/2018 | Thompson et al. |
| 2018/0130671 A1 | 5/2018 | Duan et al. |
| 2018/0144980 A1 | 5/2018 | Basu et al. |
| 2018/0358260 A1 | 12/2018 | Roy et al. |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.

* cited by examiner

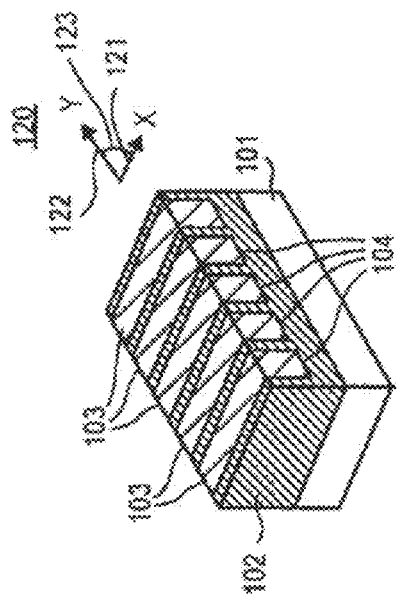
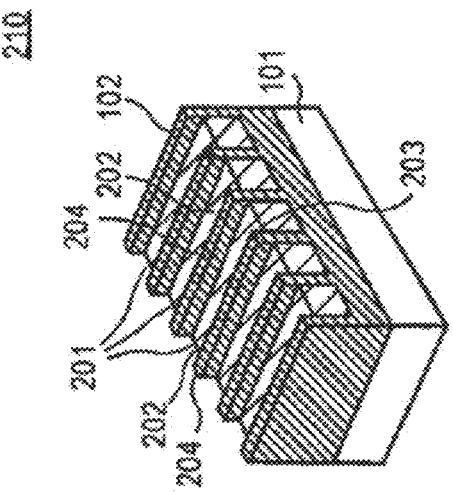
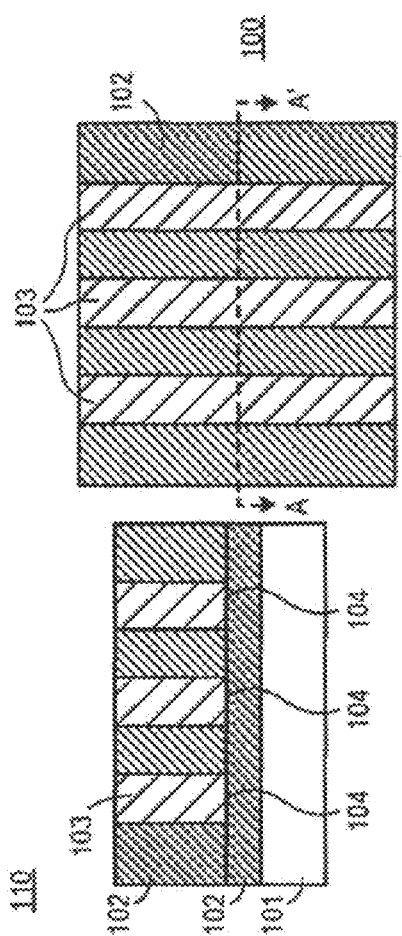
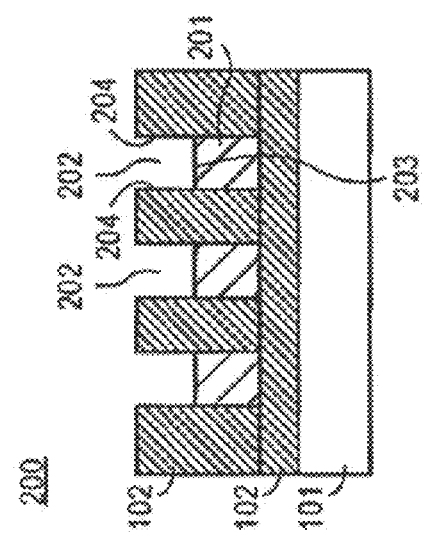
FIG. 1A
FIG. 1B
FIG. 2A
FIG. 2B

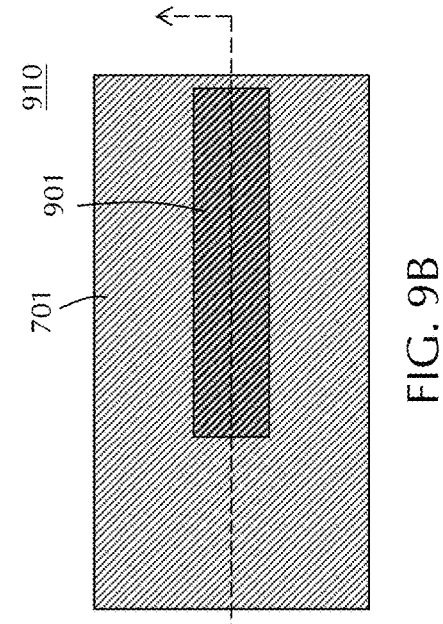
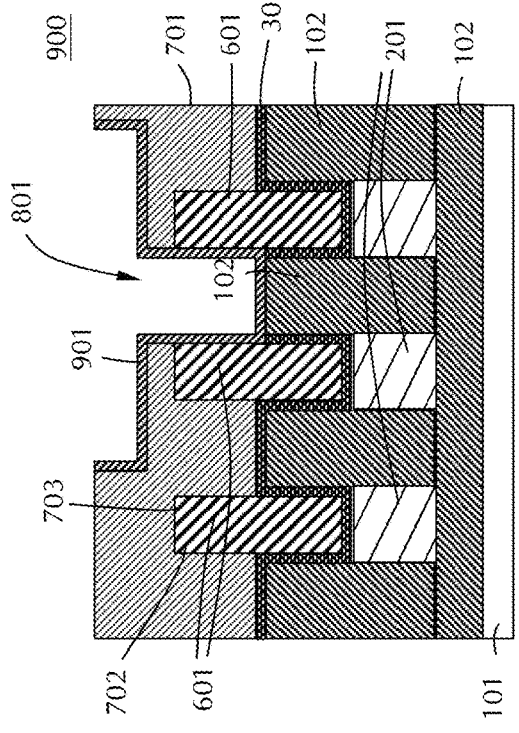
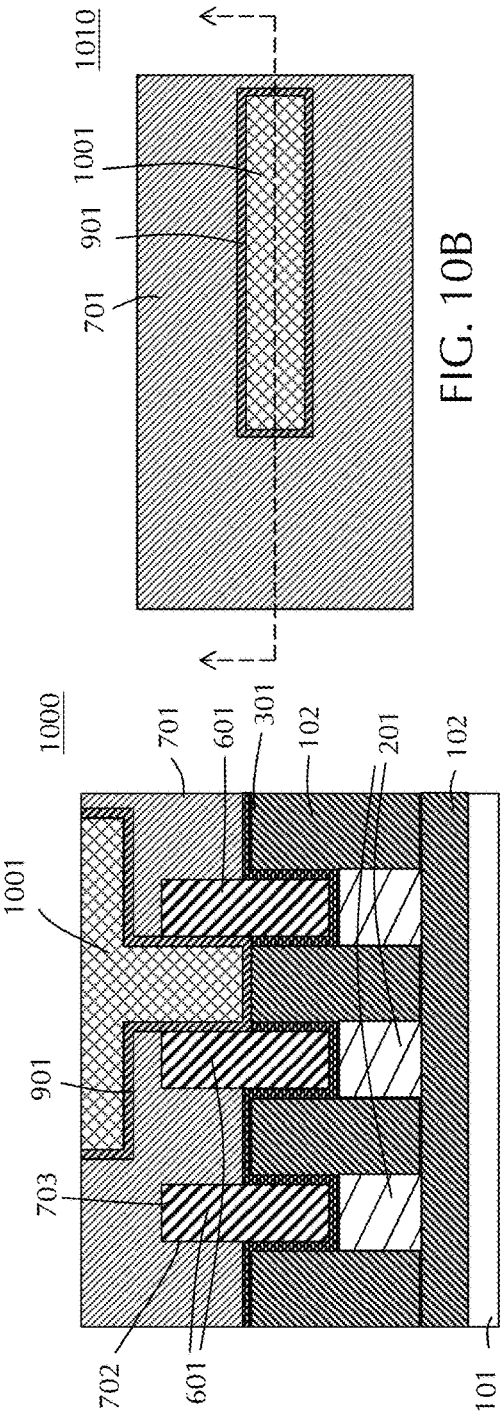
FIG. 9A
FIG. 9B
FIG. 10A
FIG. 10B

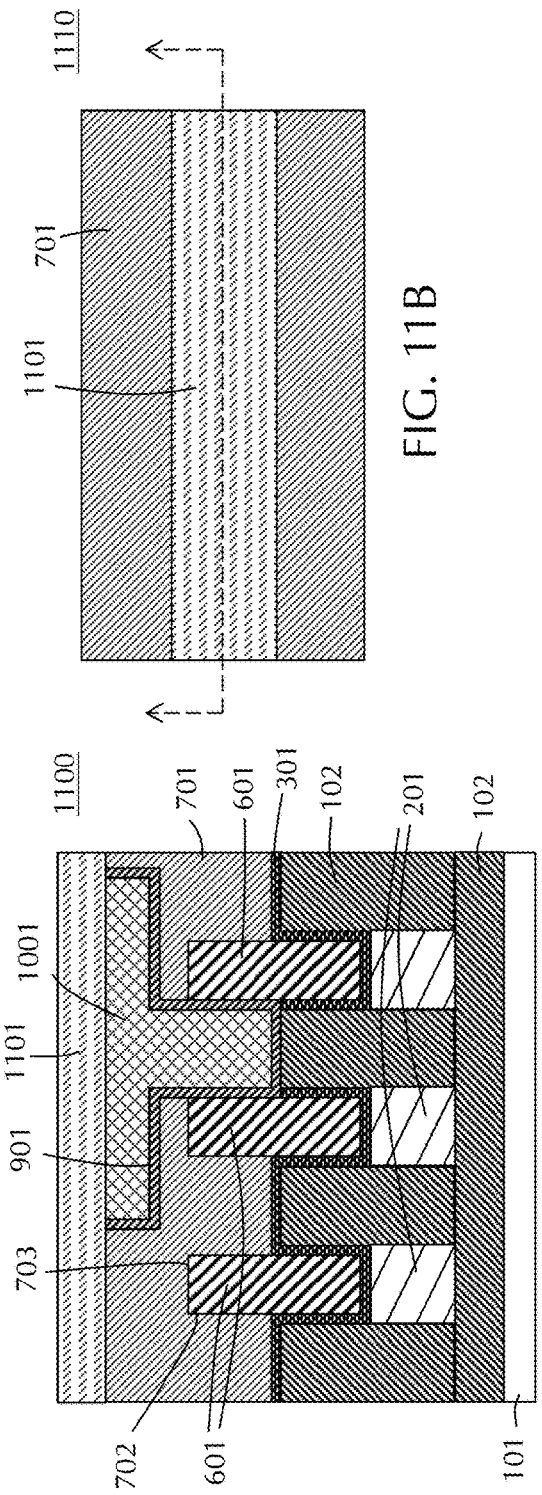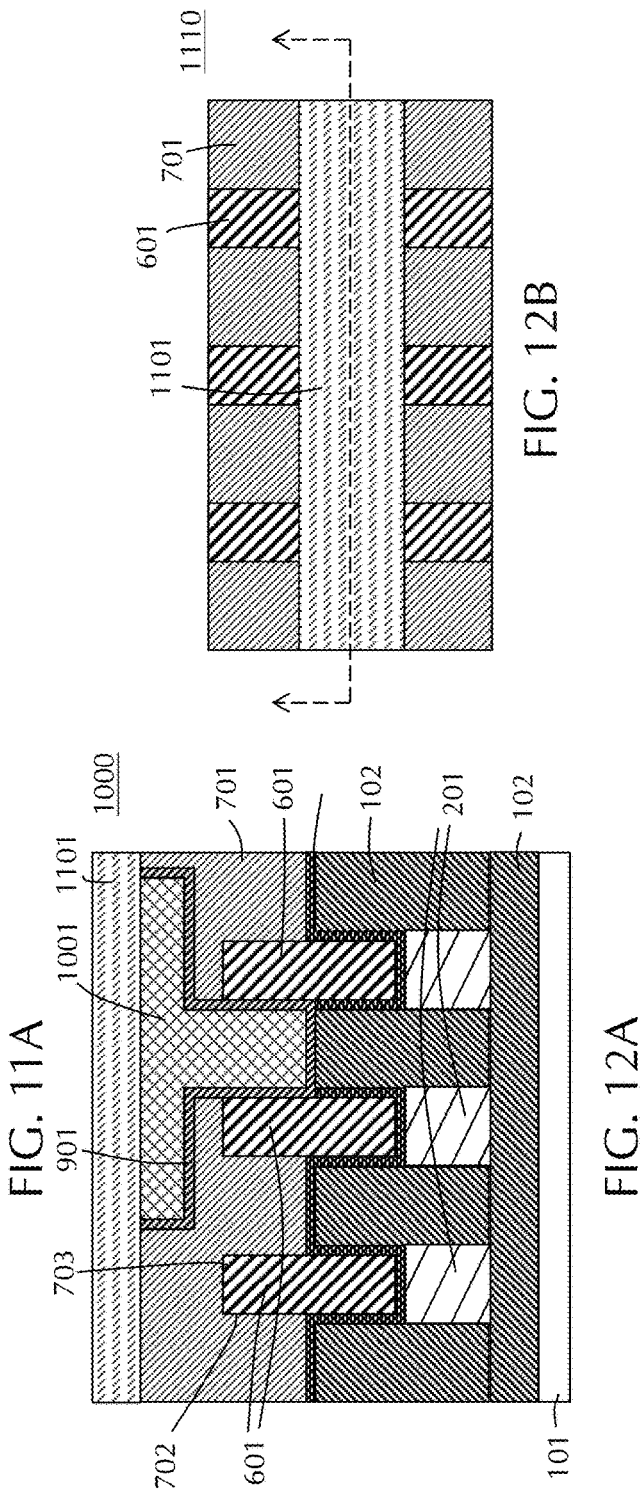

METHODS OF FORMING SELF-ALIGNED VIAS AND AIR GAPS

CROSS-REFERENCE TO RELATED APPLICATIONS

This application is a Continuation of U.S. patent application Ser. No. 16/003,827, filed on Jun. 8, 2018, which claims priority to U.S. Provisional Application No. 62/517,855, filed Jun. 10, 2017, the entire disclosures of which are hereby incorporated by reference herein.

TECHNICAL FIELD

The present disclosure relates generally to methods of depositing and etching thin films. In particular, the disclosure relates to processes for forming self-aligned vias and air gaps and devices containing same.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications.

Resistance-Capacitance (RC) delay is a challenging aspect of back end of line (BEOL) device production. The RC delay continues to increase with metal pitch scaling, metal line length increasing and metal line thickness decreasing. Reducing metal line resistance or dielectric capacitance in the back end of line is a priority of engineers working on BEOL. Low dielectric constant (k) materials are the main materials besides metals in the BEOL, which account for the capacitance that needs to be reduced. Reducing k has been a trend in the past decades. IBM introduced the air-gap gap technology around 10 years ago. However, it has not penetrated in the whole industry because of the process/design/integration complexity.

Another challenging aspect in the current semiconductor manufacture is edge placement error (EPE) appearing in the patterning steps. When patterning multiple layers, layer-to-layer connection or alignment becomes more and more difficult with smaller features. On BEOL, big EPE could cause both the resistance of interconnect and parasitic capacitance to increase which will increase the RC delay. In the worst cases, the EPE can result in the misalignment of two metal layers and device failure.

Therefore, there is a need in the art for methods for back end of line device production with decreased RC delay and/or decreased edge placement error.

SUMMARY

A method to provide self-aligned air gaps, the method comprising: recessing first conductive lines on a first dielectric layer on a substrate, the first conducting lines extending along a first direction on the first dielectric layer; forming pillars on the recessed first conductive lines; depositing a second dielectric layer between the pillars; etching the second dielectric layer to form a contact hole in the second dielectric layer between adjacent pillars; depositing a metal film in the contact hole; removing the second dielectric layer to expose the pillars; removing the pillars to form air gaps; and depositing a cap layer to enclose the air gaps.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A illustrates a top view and a cross-sectional view of an electronic device structure to provide a fully self-aligned via according to some embodiments;

FIG. 1B is a perspective view of the electronic device structure depicted in FIG. 1A;

FIG. 2A is a side cross-sectional view of the electronic device structure after the conductive lines are recessed according to some embodiments;

FIG. 2B is a top view of the electronic device structure of FIG. 2A;

FIG. 9A is a side cross-sectional view of the electronic device structure after formation of a liner in the etched structure according to some embodiments;

FIG. 9B is a top view of the electronic device structure shown in FIG. 9A;

FIG. 10A is a side cross-sectional view of the electronic device structure after gapfill of the etched structure in accordance with one or more embodiment;

FIG. 10B is a top view of the electronic device structure shown in FIG. 10A;

FIG. 11A is a side cross-sectional view of the electronic device structure after masking in accordance with one or more embodiment;

FIG. 11B is a top view of the electronic device structure shown in FIG. 11A;

FIG. 12A is a side cross-sectional view of the electronic device structure after etching the dielectric and exposing the pillars in accordance with one or more embodiment;

FIG. 12B is a top view of the electronic device structure shown in FIG. 12A;

Figure 3:
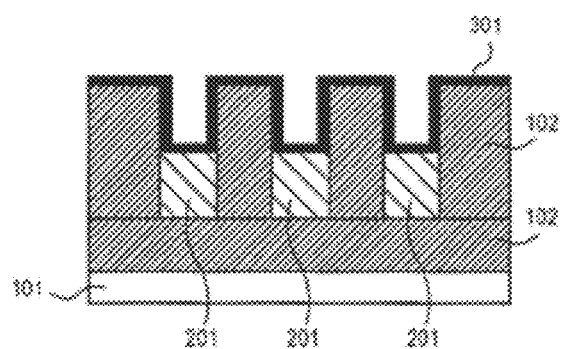
FIG. 3 is a side cross-sectional view of the electronic device structure after a liner is deposited on the recessed conductive lines according to some embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods and apparatus to provide self-aligned vias and air gaps. The various aspects of the disclosure are described with respect to a detailed process illustrated in the Figures.

FIG. 1A illustrates a top view 100 and a cross-sectional view 110 of an electronic device structure to provide a fully self-aligned via or air gap according to some embodiments. The cross-sectional view 110 is along an axis A-A', as depicted in FIG. 1A. FIG. 1B is a perspective view 120 of the electronic device structure depicted in FIG. 1A. A lower metallization layer (Mx) comprises a set of conductive lines 104 that extend along an X axis (direction) 121 on an insulating layer 102 on a substrate 101, as shown in FIGS. 1A and 1B. As shown in FIG. 1B, X direction 121 crosses a Y axis (direction) 122 at an angle 123. In one or more embodiments, angle 123 is about 90 degrees. In some embodiments, angle 123 is an angle that is other than a 90 degrees angle. The insulating layer 102 comprises trenches 104. The conductive lines 103 are deposited in trenches 104.

In some embodiments, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In some embodiments, the substrate 101 includes interconnects, for example, vias, configured to connect the metallization layers. In some embodiments, the substrate 101 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, insulating layer 102 comprises an interlayer dielectric (ILD). In some embodiments, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, insulating layer 102 includes a dielectric material having k value less than 5. In some embodiments, insulating layer 102 includes a dielectric material having k-value less than 2. In some embodiments, insulating layer 102 includes a nitride, oxide, a polymer, phosphosilicate glass, Fluorosilicate (SiOF) glass, organosilicate glass (SiOCH), other electrically insulating layer determined by an electronic device design, or any combination thereof. In some embodiments, insulating layer 102 may include polyimide, epoxy, photodefinable materials, such as benzocyclobutene (BCB), and WPR-series materials, or spin-on-glass.

In some embodiments, insulating layer 102 is a low-k interlayer dielectric to isolate one metal line from other metal lines on substrate 101. In some embodiments, the thickness of the layer 102 is in an approximate range from about 10 nanometers (nm) to about 2 microns (μm).

In some embodiments, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALO"), spin-on, or other insulating deposition techniques known to one of ordinary skill in the art of microelectronic device manufacturing.

In some embodiments, the lower metallization layer Mx comprising metal lines 103 is a part of a back end metallization of the electronic device. In some embodiments, the insulating layer 102 is patterned and etched using a hard mask to form trenches 104 using one or more patterning and etching techniques known to one of ordinary skill in the art of microelectronic device manufacturing. In some embodiments, the size of trenches in the insulating layer 104 is determined by the size of conductive lines formed later on in a process.

In some embodiments, forming the conductive lines 103 involves filling the trenches 104 with a layer of conductive material. In some embodiments, a base layer (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base layer of copper, by an electroplating process. In some embodiments, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electroless, a CVD, PVD, MBE, MOCVD, ALO, spin-on, or other deposition techniques known to one of ordinary skill in the art of microelectronic device manufacturing.

In some embodiments, the choice of a material for conductive layer for the conductive lines 103 determined the choice of a material for the seed layer. For example, if the material for the conductive lines 103 includes copper, the material for the seed layer also includes copper. In some embodiments, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum PI, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 103 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In some embodiments, the lower metallization layer Mx is configured to connect to other metallization layers (not shown). In some embodiments, the metallization layer Mx is configured to provide electrical contact Io electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

FIG. 2A is a view 200 similar to view 110 of FIG. 1A, after the conductive lines 103 are recessed according to some embodiments. FIG. 2B is a view 210 similar to FIG. 1B, after the conductive lines 103 are recessed according to some embodiments. The conductive lines 103 are recessed to a predetermined depth to form recessed conductive lines 201. As shown in FIGS. 2A and 2B, trenches 202 are formed in the insulating layer 102. Each trench 202 has sidewalls 204 that are portions of insulating layer 102 and a bottom that is a top surface 203 of the recessed conductive line 201.

In some embodiments, the depth of the trenches 202 is from about 10 nm to about 500 nm. In some embodiments, the depth of the trenches 202 is from about 10% to about 100% of the thicknesses of the conductive lines. In some embodiments, the conductive lines 103 are recessed using one or more of wet etching, dry etching, or a combination of techniques known to one of ordinary skill in the art of electronic device manufacturing.

FIG. 3 is a view 300 similar to FIG. 2A, after a liner 301 is deposited on the recessed conductive lines 201 according to some embodiments. Liner 301 is deposited on the bottom and sidewalls of the trenches 202, as shown in FIG. 3.

In some embodiments, liner 301 is deposited to protect the conductive lines 201 from changing the properties later on in a process (e.g., during tungsten deposition, or other processes). In some embodiments, liner 301 is a conductive liner. In another embodiment, liner 301 is a non-conductive liner. In some embodiments, when liner 301 is a non-conductive liner, the liner 301 is removed later on in a process, as described in further detail below. In some embodiments, liner 301 includes titanium nitride (TiN), titanium (Ti), tantalum (Ta), tantalum nitride (TaN), or any combination thereof. In another embodiment, liner 301 is an oxide, e.g., aluminum oxide (AlO), titanium oxide ($TiO_2$). In yet another embodiment, liner 301 is a nitride, e.g., silicon nitride (SiN). In an embodiment, the liner 301 is deposited to the thickness from about 0.5 nm to about 10 nm.

In some embodiments, the liner 301 is deposited using an atomic layer deposition (ALD) technique. In some embodiments, the liner 301 is deposited using one of deposition techniques, such as but not limited to a CVD, PVD, MBE, MOCVD, spin-on, or other liner deposition techniques known to one of ordinary skill in the art of microelectronic device manufacturing.

Figure 4:
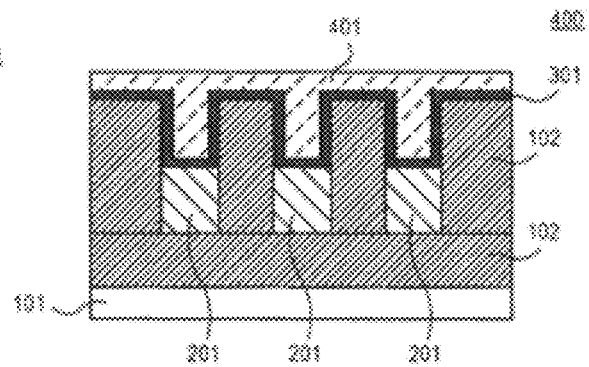
FIG. 4 is a side cross-sectional view of the electronic device structure after a seed gapfill layer is deposited on the liner according to some embodiments.

FIG. 4 is a view 400 similar to FIG. 3, after a seed gapfill layer 401 is deposited on the liner 301 according to some embodiments. In some embodiments, seed gapfill layer 401 is a self-aligned selective growth seed film. As shown in FIG. 4, seed gapfill layer 401 is deposited on liner 301 on the top surface 203 of the recessed conductive lines 201, the sidewalls 204 of the trenches 202 and top portions of the insulating layer 102. In some embodiments, seed gapfill layer 401 is a tungsten (W) layer, or other seed gapfill layer to provide selective growth pillars. In some embodiments, seed gapfill layer 401 is a metal film or a metal containing film. Suitable metal films include, but are not limited to, films including one or more of Co, Mo, W, Ta, Ti, Ru, rhodium (Rh), Cu, Fe, Mn, V, Niobium (Nb), hafnium (Hf), Zirconium (Zr), Yttrium (Y), Al, Sn, Cr, Lanthanum (La), or any combination thereof. In some embodiments, seed gapfill layer 401 comprises is a tungsten (W) seed gapfill layer.

In some embodiments, the seed gapfill layer 401 is deposited using one of deposition techniques, such as but not limited to an ALD, a CVD, PVD, MBE, MOCVD, spin-on, or other liner deposition techniques known to one of ordinary skill in the art of microelectronic device manufacturing.

Figure 5A:
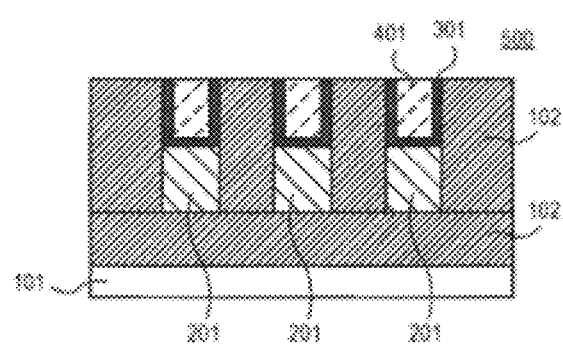
FIG. 5A is a side cross-sectional view of the electronic device structure after portions of the seed gapfill layer are removed to expose top portions of the insulating layer according to some embodiments.
Figure 5B:
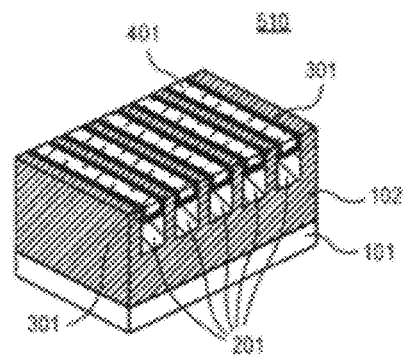
FIG. 5B is a perspective view of the electronic device structure shown in FIG. 5A.

FIG. 5A is a view 500 similar to FIG. 4, after portions of the seed gapfill layer 401 are removed to expose top portions of the insulating layer 102 according to one embodiment. FIG. 5B is a perspective view of the electronic device structure shown in FIG. 5A. In some embodiments, the portions of the seed gapfill layer 401 are removed using one of the chemical-mechanical polishing (CMP) techniques known to one of ordinary skill in the art of microelectronic device manufacturing.

Figure 6A:
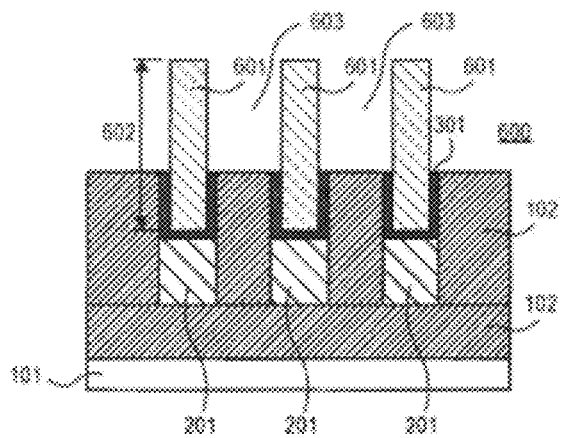
FIG. 6A is a side cross-sectional view of the electronic device structure after self-aligned selective growth pillars are formed according to some embodiments.
Figure 6B:
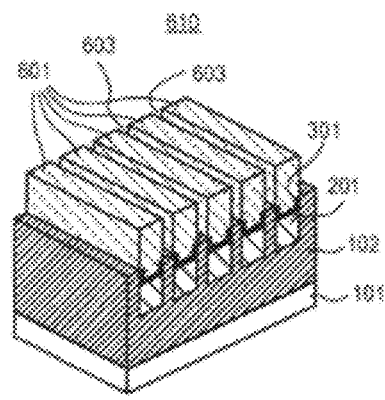
FIG. 6B is a perspective view of the electronic device structure shown in FIG. 6A.

FIG. 6A is a view 600 similar to FIG. 5A, and FIG. 6B is a view 610 similar to FIG. 5B, after self-aligned selective growth pillars 601 are formed using the seed gap fill layer 401 on the liner 301 on the recessed conductive lines 201 according to one or more embodiment. As shown in FIGS. 6A and 6B, an array of the self-aligned selective growth pillars 601 has the same pattern as the set of the conductive lines 201. As shown in FIGS. 6A and 6B, the pillars 601 extend substantially orthogonally from the top surfaces of the conductive lines 201. As shown in FIGS. 6A and 6B, the pillars 601 extend along the same direction as the conductive lines 201. As shown in FIGS. 6A and 6B, the pillars 601 are separated by gaps 603.

In some embodiments, the pillars 601 are selectively grown from the seed gapfill layer 401 on portions of the liner 301 on the conductive lines 201. The pillars 601 are not grown on portions of the liner 301 on the insulating layer 102, as shown in FIGS. 6A and 6B. In some embodiments, portions of the seed gapfill layer 401 above the conductive lines 201 are expanded for example, by oxidation, nitridation, or other process to grow pillars 601. In some embodiments, the seed gapfill layer 401 is oxidized by exposure to an oxidizing agent or oxidizing conditions to transform the metal or metal containing seed gapfill layer 401 to metal oxide pillars 601. In some embodiments, pillars 601 include an oxide of one or more metals listed above. In more specific embodiment, pillars 601 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In some embodiments, the pillars 601 are formed by oxidation of the seed gapfill layer at any suitable temperature depending on, for example, the composition of the seed gapfill layer and the oxidizing agent. In some embodiments, the oxidation occurs at a temperature in an approximate range of about 25 degrees C. to about 800 degrees C. In some embodiments, the oxidation occurs at a temperature greater than or equal to about 150° C. In some embodiments, the height 602 of the pillars 601 is in an approximate range from about 5 angstroms (A.) to about 10 microns (µm).

Figure 7A:
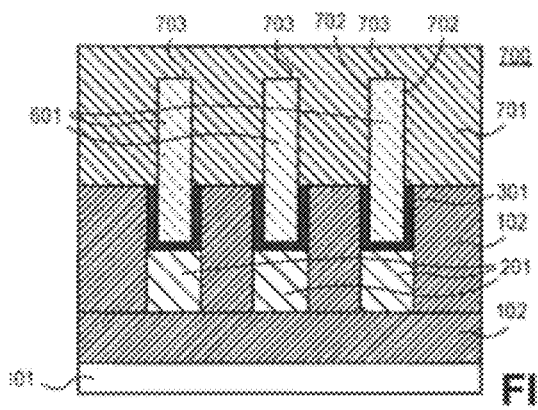
FIG. 7A is a side cross-sectional view of the electronic device structure after an insulating layer is deposited to overfill the gaps between the pillars according to some embodiments.
Figure 7B:
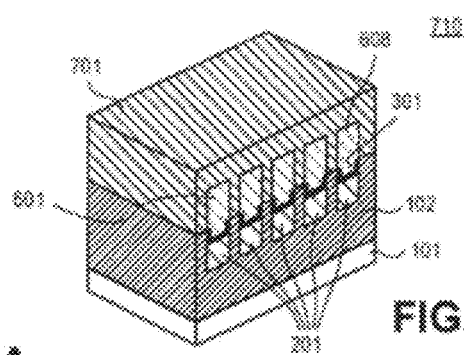
FIG. 7B is a perspective view of the electronic device structure shown in FIG. 7A.

FIG. 7A is a view 700 similar to FIG. 6A, and FIG. 7B is a view 710 similar to FIG. 6B, after an insulating layer 701 is deposited to overfill the gaps 603 between the pillars 601 according to some embodiments. As shown in FIGS. 7A and 7B, insulating layer 701 is deposited on the opposing sidewalls 702 and top portions 703 of the pillars 601 and through the gaps 603 on the portions of the insulating layer 102 and liner 301 between the pillars 601.

In some embodiments, insulating layer 701 is a low-k gapfill layer. In one embodiment, insulating layer 701 is a flowable silicon oxide (FSiOx) layer. In some embodiments, insulating layer 701 is an oxide layer, e.g., silicon dioxide, or any other electrically insulating layer determined by an electronic device design. In some embodiments, insulating layer 701 is an interlayer dielectric (ILD). In some embodiments, insulating layer 701 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 701 is a dielectric material having k-value less than 3.

In some embodiments, insulating layer 701 is a dielectric material having k-value in an approximate range from about 2.2 to about 2.7. In some embodiments, insulating layer 701 includes a dielectric material having k-value less than 2. In some embodiments, insulating layer 701 represents one of the insulating layers described above with respect to insulating layer 102.

In some embodiments, insulating layer 701 is a low-k interlayer dielectric to isolate one metal line from other metal lines. In some embodiments, insulating layer 701 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 8A:
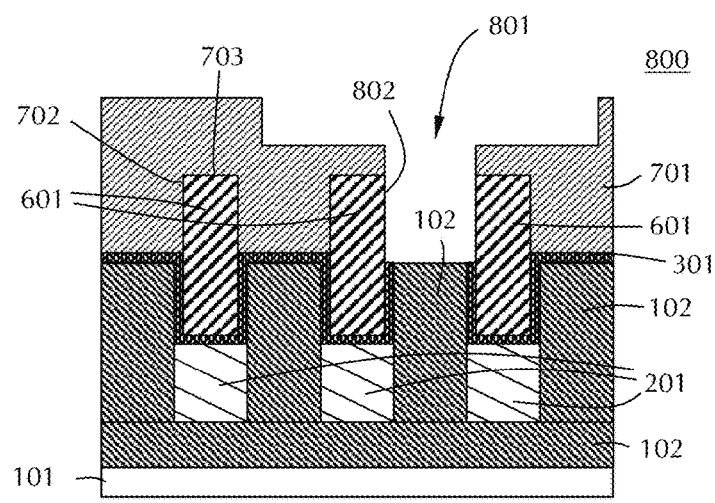
FIG. 8A is a side cross-sectional view of the electronic device structure after a dual damascene etch according to some embodiments.
Figure 8B:
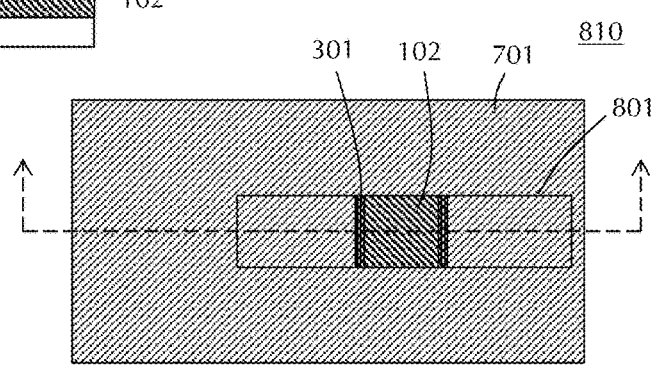
FIG. 8B is a top view of the electronic device structure shown in FIG. 8A.

FIG. 8A is a view 800 similar to FIG. 7A, and FIG. 8B is a view 810 similar to FIG. 7B, after an insulating layer 701 is deposited a dual damascene etch 801 is performed in the insulating layer 701. The dual damascene etch can be performed by any suitable method known to those skilled in the art. Briefly, a mask (not shown) is applied or positioned adjacent insulting layer 701 and the etch 801 is performed through the mask. The etch 801 extends through insulating layer 701, extending between two adjacent pillars 601. The sides 802 of the etch 801 can extend up to a side of the pillar 601. The etch 801 removes liner 301 between the adjacent pillars 601 to expose insulating layer 102. A top view 810 shows a rectangular etch 801 in insulating layer 701 exposing the insulating layer 102 with liner 301 on either side of the insulating layer 102. The opening between the adjacent pillars 601 is referred to as a contact hole.

FIG. 9A is a view 900 similar to FIG. 8A, and FIG. 9B is a view 910 similar to FIG. 8B, after the dual damascene etch 801 a conformal liner 901 is formed in the opening formed by the etch 801.

In some embodiments, liner 901 is deposited to protect the dielectric 701, pillar 601 and/or dielectric 301 from later processes (e.g., during tungsten deposition, or other processes). In some embodiments, liner 901 is a conductive liner. In another embodiment, liner 901 is a non-conductive liner. In some embodiments, when liner 901 is a non-conductive liner, the liner 901 can be removed later on in a process, as described in further detail below. In some embodiments, liner 901 includes titanium nitride (TiN), titanium (Ti), tantalum (Ta), tantalum nitride (TaN), or any combination thereof. In another embodiment, liner 901 is an oxide, e.g., aluminum oxide (AlO), titanium oxide ($TiO_2$). In yet another embodiment, liner 901 is a nitride, e.g., silicon nitride (SiN). In an embodiment, the liner 901 is deposited to the thickness from about 0.5 nm to about 10 nm.

In some embodiments, the liner 901 is deposited using an atomic layer deposition (ALD) technique. In some embodiments, the liner 901 is deposited using one of deposition techniques, such as but not limited to a CVD, PVD, MBE, MOCVD, spin-on, or other liner deposition techniques known to one of ordinary skill in the art of microelectronic device manufacturing.

Liner 901 forms conformally on dielectric 701 and dielectric 102. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the liner 901 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

FIG. 10A is a view 1000 similar to FIG. 9A, and FIG. 10B is a view 1010 similar to FIG. 9B, after the conformal liner 901 is deposited, a metal 1001 (also referred to as M2) is deposited in the opening formed by etch 801 lined with liner 901. FIG. 10 shows the metal 1001 even with the top of the dielectric 701. The even top can be formed by depositing the gapfill metal 1001 to provide a sufficient amount of overburden on the surface followed by a chemical mechanical planarization process to form an even surface.

The metal 1001 can be any suitable metal. In some embodiments, the film 130 is a metal film or a metal containing film. Suitable metal films include, but are not limited to, films including one or more of Co, Mo, W, Ta, Ti, Ru, Rh, Cu, Fe, Mn, V, Nb, Hf, Zr, Y, Al, Sn, Cr and/or La. In some embodiments, the metal film comprises tungsten. In another embodiment, the metal 1001 is deposited using an atomic layer deposition (ALD) technique. In some embodiments, the metal 1001 is deposited using one of deposition techniques, such as but not limited to a CVD, PVD, MBE, MOCVD, spin-on, or other liner deposition techniques known to one of ordinary skill in the art of microelectronic device manufacturing.

FIG. 11A is a view 1100 similar to FIG. 10A, and FIG. 11B is a view 1110 similar to FIG. 10B. After deposition of the M2 metal 1001, a mask 1101 is applied to cover the via formed by metal 1001. The top view of FIG. 11B shows the metal 1001 covered and protected by the mask 1101. The mask can be any suitable mask that can protect the metal 1001 for subsequent processes.

FIGS. 12A and 12B illustrates the result of etching after mask 1101 has been applied. The side view 1101 in FIG. 12A appears the same as FIG. 11A because the changes due to etching occur in a different plane that that illustrated. FIG. 12B shows a top view 1110 with the dielectric 701 and pillar 601 exposed.

Figure 13B:
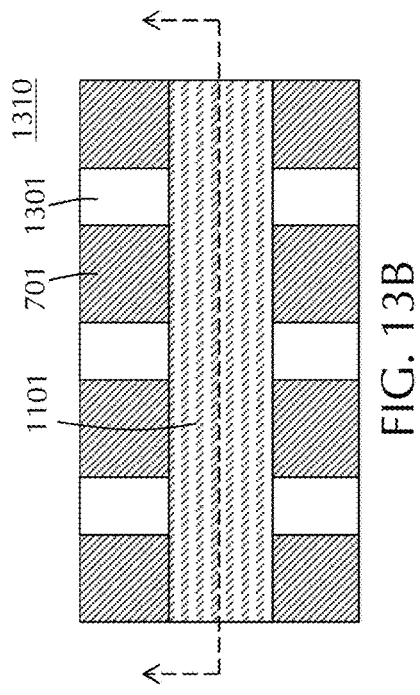
FIG. 13B is a top view of the electronic device structure shown in FIG. 13A.
Figure 13A:
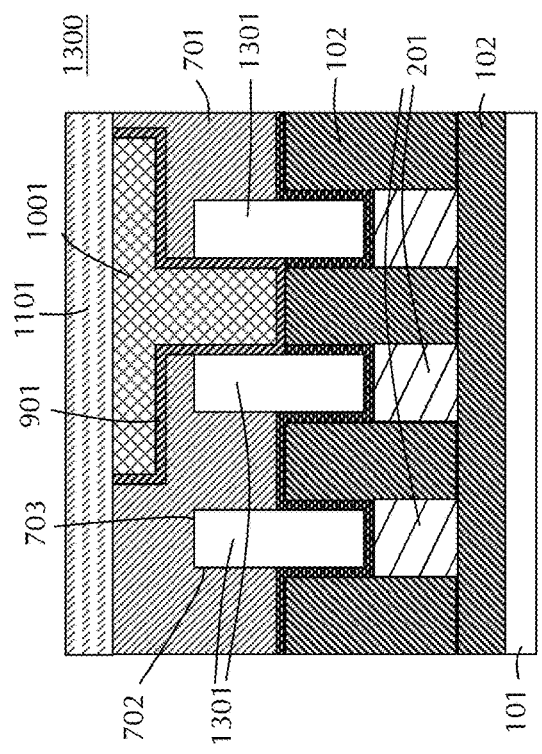
FIG. 13A is a side cross-sectional view of the electronic device structure after removal of the pillars in accordance with one or more embodiment.

FIGS. 13A and 13B show side view 1300 and top view 1310 after removal of the pillars 601 to leave air gaps 1301. Removal of the pillars 601 can be done by an isotropic etch that can etch sideways to remove material from beneath the mask 1101. The etching or removal process can be selective for the pillar 601 material relative to the liner 301, liner 901 and/or dielectric 701. In some embodiments, etching removes substantially all of the pillar 601 leaving air gap 1301 having substantially the same shape and size of the pillar 601. As used in this regard, the term "all of the pillar" means that greater than or equal to about 90%, 95%, 98% or 99% of the pillar (by volume) is removed.

Etching of the pillars 601 can be done by any suitable technique. In some embodiments, etching the pillars 601 comprises exposing the pillars 601 to a metal halide compound. In some embodiments, the metal halide compound has a different metal than the pillars 601.

In some embodiments, etching the pillars 601 comprises exposure to a metal-and-halogen-containing precursor (e.g. $WCl_6$), also referred to as a metal halide precursor. The metal halide precursor can react with the pillars 601.

In some embodiments, exposure to the metal halide precursor causes an exothermic reaction with the pillar material and no plasma is present in the substrate processing region. No plasma excites the metal-halide precursor prior to entering the substrate processing region according to one or more embodiments.

In an exemplary non-limiting process, the pillars comprise tungsten and grown by reaction with oxygen to form the tungsten oxide pillars, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

The etch processes of some embodiments has a selectivity greater than or equal to about 10:1, greater than or equal to about 15:1, greater than or equal to about 20:1 or greater than or equal to about 25:1.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

Figure 14B:
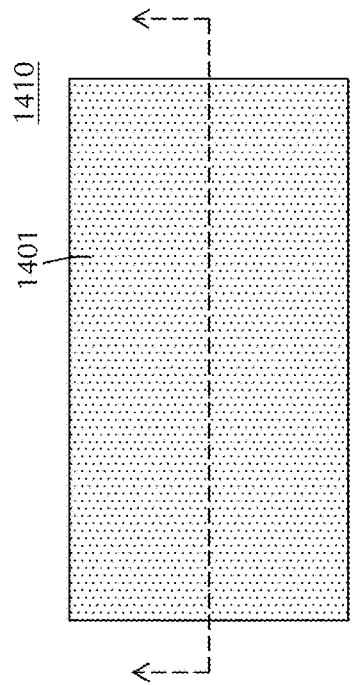
FIG. 14B is a top view of the electronic device structure shown in FIG. 14A.
Figure 14A:
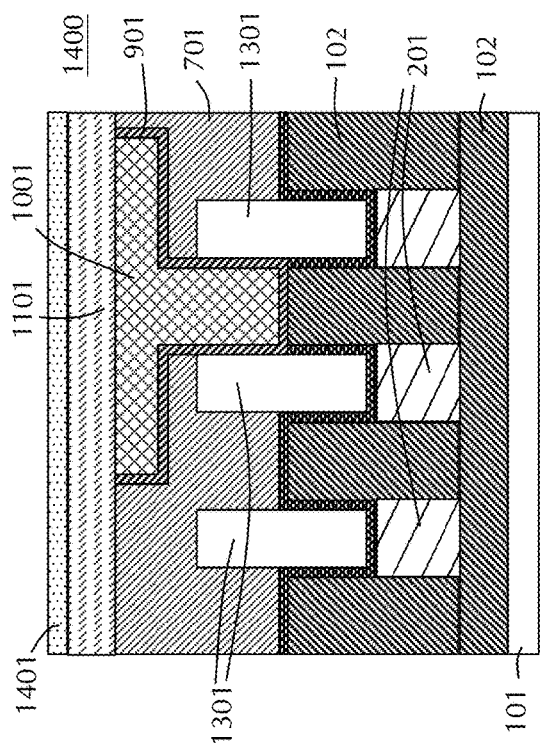
FIG. 14A is a side cross-sectional view of the electronic device structure after blanket deposition in accordance with one or more embodiment.

FIGS. 14A and 14B illustrate a side view 1400 and top view 1410 after blanket deposition of film 1401. Film 1401 can be any suitable material that does not fill the air gaps 1301 formed from the pillars. In some embodiments, the film 1401 is deposited by a plasma enhanced process. In some embodiments, the film 1401 is a non-conformal film. In some embodiments, the film 1401 comprises an insulating material.

Figure 15:
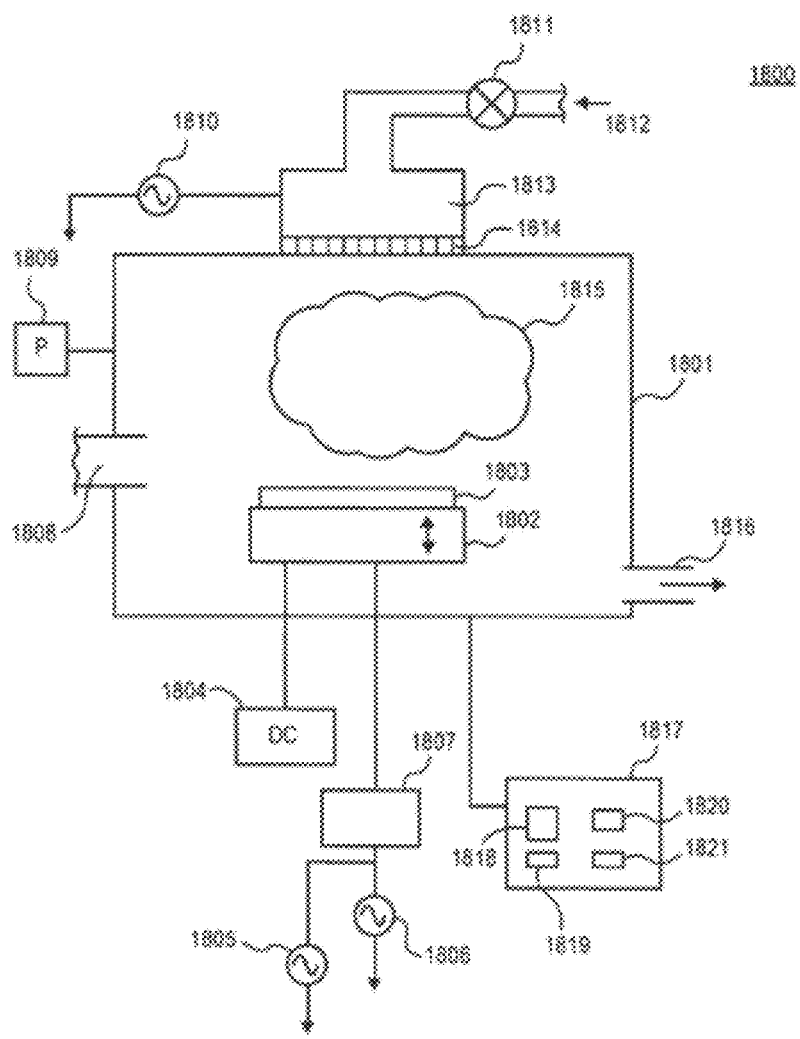
FIG. 15 shows a schematic of a processing chamber to form the electronic device structure in accordance with one or more embodiment of the disclosure.

FIG. 15 shows a block diagram of a plasma system to perform at least some of the operations Io provide a fully self-aligned via according to one embodiment. As shown in FIG. 15, system 1800 has a processing chamber 1801. A movable pedestal 1802 to hold an electronic device structure 1803 is placed in processing chamber 1801. Pedestal 1802 comprises an electrostatic chuck ("ESC"), a DC electrode embedded into the ESC, and a cooling/heating base. In an embodiment, pedestal 1802 acts as a moving cathode. In an embodiment, the ESC comprises an $Al_2O_3$ material, $Y_2O_3$, or other ceramic materials known to one of ordinary skill of electronic device manufacturing. A DC power supply 1804 is connected to the DC electrode of the pedestal 1802.

As shown in FIG. 15, an electronic device structure 1803 is loaded through an opening 1808 and placed on the pedestal 1802. The electronic device structure 1803 represents one of the electronic device structures described above. System 1800 comprises an inlet to input one or more process gases 1812 through a mass flow controller 1811 to a plasma source 1813. A plasma source 1813 comprising a showerhead 1814 is coupled to the processing chamber 1801 to receive one or more gases 1812 to generate plasma. Plasma source 1813 is coupled to a RF source power 1810. Plasma source 1813 through showerhead 1814 generates a plasma 1815 in processing chamber 1801 from one or more process gases 1812 using a high frequency electric field. Plasma 1815 comprises plasma particles, such as ions, electrons, radicals or any combination thereof. In an embodiment, power source 1810 supplies power from about 50 W to about 3000 W at a frequency from about 400 kHz to about 162 MHz to generate plasma 1815.

A plasma bias power 1805 is coupled Io the pedestal 1802 (e.g., cathode) via a RF match 1807 to energize the plasma. In an embodiment, the plasma bias power 1805 provides a bias power that is not greater than 1000 W at a frequency between about 2 MHz to 60 MHz. and in a particular embodiment at about 13 MHz. A plasma bias power 1806 may also be provided. for example to provide another bias power that is not greater than 1000 W at a frequency from about 400 kHz to about 60 MHz, and in a particular embodiment, at about 60 MHz. Plasma bias power 1806 and bias power 1805 are connected Io RF match 1807 to provide a dual frequency bias power. In an embodiment. a total bias power applied Io the pedestal 1802 is from about 10 W to about 3000 W.

As shown in FIG. 15, a pressure control system 1809 provides a pressure to processing chamber 1801. As shown in FIG. 15, chamber 1801 has one or more exhaust outlets 1816 Io evacuate volatile products produced during processing in the chamber. In an embodiment, the plasma system 1800 is an inductively coupled plasma (ICP) system. In an embodiment. the plasma system 180 is a capacitively coupled plasma (CCP) system.

A control system 1817 is coupled to the chamber 1801. The control system 1817 comprises a processor 1818. a temperature controller 1819 coupled to the processor 1818, a memory 1820 coupled to the processor 1818. and input/ output devices 1821 coupled to the processor 1818 to form fully self-aligned via as described herein.

In one embodiment, the processor 1018 has a configuration to control recessing first conductive lines on a first insulating layer on a substrate, the first conductive lines extending along a first direction on the first insulating layer. The processor 1018 has a configuration Io control depositing a liner on the recessed first conductive lines. The processor has a configuration to control selectively growing a seed layer on the recessed first conductive lines. The processor 1018 has a configuration to control forming pillars using the selectively grown seed layer. The processor 1018 has a configuration Io control depositing a second insulating layer between the pillars. The processor 1018 has a configuration to control removing the pillars to form air gaps (or trenches) in the second insulating layer. The processor 1018 has a configuration to control depositing a conductive layer into the contact hole, as described above.

The control system 1817 is configured to perform at least some of the methods as described herein and may be either software or hardware or a combination of both. The plasma system 1800 may be any type of high performance processing plasma systems known in the art, such as but not limited to an etcher, a cleaner, a furnace, or any other plasma system to manufacture electronic devices.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "some embodiments," "certain embodiments," "one or more embodiments" or "an embodiment" means that a particular feature, structure, material, or characteristic described in connection with the embodiment is included in some embodiments of the invention. Thus, the appearances of the phrases such as "in one or more embodiments," "in certain embodiments," "in some embodiments" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An electronic device comprising:
   a first metallization layer comprising first conductive lines extending along an X direction on a first insulating layer on a substrate, the first conductive lines recessed below a top surface of the first insulating layer;
   a second insulating layer on the first insulating layer;
   an air gap fully self-aligned along the X direction and a Y direction to one of the first conductive lines, the air gap formed in the second insulating layer and in the first insulating layer and extending to the first conductive lines, the second insulating layer enclosing the air gap; and
   a contact hole filled with a metal film, the contact hole extending from a top surface of the second insulating layer to the top surface of the first insulating layer, and directly adjacent to the air gap.

2. The electronic device of claim 1, further comprising a conformal liner on the first conductive lines and the first insulating layer.

3. The electronic device of claim 2, wherein the conformal liner is a conductive liner.

4. The electronic device of claim 2, wherein the conformal liner is a non-conductive liner.

5. The electronic device of claim 1, further comprising a second conformal liner in the contact hole and on the second insulating layer.

6. The electronic device of claim 1, wherein the first insulating layer comprises a low-k insulating.

7. The electronic device of claim 1, wherein the second insulating layer is a flowable film.

8. The electronic device of claim 1, wherein the first conductive lines are selected from copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Au), platinum Pl, indium (In), tin (Sn), lead (Pb), antimony (Sb), bismuth (Bi), zinc (Zn), cadmium (Cd), or any combination thereof.

9. The electronic device of claim 1, wherein the metal film comprises one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), or lanthanum (La).

10. The electronic device of claim 1, wherein the metal film comprises tungsten (W).

11. The electronic device of claim 1, further comprising a mask on the metal film and the second insulating layer.

* * * * *